(12) United States Patent
Kim (10) Patent No.: US 9,633,700 B2
(45) Date of Patent: Apr. 25, 2017

(54) POWER ON RESET CIRCUIT AND SEMICONDUCTOR MEMORY DEVICE INCLUDING THE SAME

(71) Applicant: SK hynix Inc., Gyeonggi-do (KR)

(72) Inventor: Do Young Kim, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 14/943,288

(22) Filed: Nov. 17, 2015

(65) Prior Publication Data

US 2017/0011780 A1 Jan. 12, 2017

(30) Foreign Application Priority Data

Jul. 10, 2015 (KR) .................. 10-2015-0098500

(51) Int. Cl.
*G11C 5/14* (2006.01)
*H03K 17/22* (2006.01)

(52) U.S. Cl.
CPC .......... *G11C 5/148* (2013.01); *H03K 17/223* (2013.01)

(58) Field of Classification Search
CPC .............................. G11C 5/148; H03K 17/223
USPC .......................................... 365/226; 327/143
See application file for complete search history.

(56) References Cited

U.S. PATENT DOCUMENTS

| | | | | |
|---|---|---|---|---|
| 6,052,006 A * | 4/2000 | Talaga, Jr. | ........... | H03K 17/223 327/143 |
| 7,348,814 B2 * | 3/2008 | Chen | .................... | H03K 17/223 327/142 |
| 7,391,665 B1 * | 6/2008 | Maung | ................... | G11C 5/147 365/226 |
| 7,602,225 B2 * | 10/2009 | Seo | ........................... | G06F 1/24 327/142 |
| 7,667,506 B2 * | 2/2010 | Mawet | ...................... | G06F 1/24 323/315 |
| 7,711,971 B1 * | 5/2010 | Jurgilewicz | ............. | G06F 1/305 323/243 |
| 7,848,170 B2 * | 12/2010 | Sugiura | .................... | G11C 5/02 365/189.08 |
| 7,915,930 B2 * | 3/2011 | Sohn | ..................... | H03K 17/223 327/142 |
| 7,948,284 B2 * | 5/2011 | Watanabe | ............ | H03K 17/223 327/142 |
| 7,969,212 B2 * | 6/2011 | Rho | ...................... | H03K 17/223 327/142 |
| 8,536,907 B2 * | 9/2013 | Chen | .................... | H03K 17/223 327/142 |
| 9,411,350 B1 * | 8/2016 | Yem | ....................... | H02M 1/36 |
| 2002/0033720 A1 * | 3/2002 | Ikehashi | ................ | G11O 5/143 327/143 |

(Continued)

FOREIGN PATENT DOCUMENTS

| KR | 1020050119078 | 12/2005 |
|---|---|---|
| KR | 1020120122983 | 11/2012 |

*Primary Examiner* — Viet Q Nguyen
(74) *Attorney, Agent, or Firm* — IP & T Group LLP (57) ABSTRACT

Provided herein is a power on reset circuit including a voltage dividing unit suitable for dividing an external power supply voltage according to a resistance ratio to output a divided voltage, a signal generating unit suitable for outputting a power on reset signal when the divided voltage has a set level or higher, and a resistance adjusting unit suitable for adjusting the resistance ratio of the voltage dividing unit in response to the power on reset signal.

17 Claims, 6 Drawing Sheets

(56) References Cited

U.S. PATENT DOCUMENTS

| | | | |
|---|---|---|---|
| 2003/0189450 A1* | 10/2003 | Kamata | H03K 17/223 327/143 |
| 2003/0231035 A1* | 12/2003 | Govil | H03K 17/223 327/143 |
| 2004/0036514 A1* | 2/2004 | Kwon | H03K 17/223 327/143 |
| 2004/0041601 A1* | 3/2004 | Payne | H03K 17/145 327/143 |
| 2005/0264347 A1* | 12/2005 | Gyohten | G05F 1/465 327/540 |
| 2007/0046341 A1* | 3/2007 | Tanzawa | H03K 17/22 327/143 |
| 2007/0076492 A1* | 4/2007 | Arakawa | G11C 5/145 365/189.11 |
| 2008/0175062 A1* | 7/2008 | Tran | G11C 16/26 365/185.21 |
| 2008/0246509 A1* | 10/2008 | Xiao | G06F 1/24 326/39 |
| 2009/0102522 A1* | 4/2009 | Tang | H03K 17/223 327/143 |
| 2009/0267682 A1* | 10/2009 | Hehemann | H03K 17/223 327/530 |
| 2013/0169255 A1* | 7/2013 | Daigle | G05F 1/56 323/284 |
| 2014/0028360 A1* | 1/2014 | Lee | H03L 7/00 327/143 |

\* cited by examiner

POWER ON RESET CIRCUIT AND SEMICONDUCTOR MEMORY DEVICE INCLUDING THE SAME

CROSS-REFERENCE TO RELATED APPLICATION

The present application claims priority to Korean patent application number 10-2015-0098500, filed on Jul. 10, 2015, the entire disclosure of which is herein incorporated by reference in its entirety.

BACKGROUND

Field of Invention

Various embodiments of the present disclosure relate to an electronic device, and more particularly, to a power on reset circuit and a semiconductor memory device including the same.

Description of Related Art

Semiconductor memory devices are memory devices realized using a semiconductor such as silicon (Si), germanium (Ge), gallium arsenide (GaAs), Indium phosphide (InP), or the like. The semiconductor memory devices are largely categorized into a volatile memory device and a nonvolatile memory device.

The volatile memory device is a memory device in which data stored therein is lost when power is turned off. The volatile memory device includes a static RAM (SRAM), dynamic RAM (DRAM), synchronous DRAM (SDRAM), or the like. The nonvolatile memory device is a memory device in which data stored therein is maintained even when power is turned off. The nonvolatile memory device includes a read only memory (ROM), programmable ROM (PROM), Electrically Programmable ROM (EPROM), Electrically Erasable and Programmable ROM (EEPROM), Flash memory, Phase-change RAM (PRAM), Magnetic RAM (MRAM), Resistive RAM (RRAM), Ferroelectric RAM (FRAM), or the like. Flash memory devices are largely divided into a NOR type and NAND type.

The semiconductor memory device has a power on reset circuit, which generates a power on reset (POR) signal. The semiconductor memory device avoids malfunctioning by generating the POR signal upon receiving external power from the outside thereof and initializing an internal circuit.

SUMMARY

Various embodiments of the present disclosure are directed to a power on reset circuit capable of performing a stable power on reset operation and word line discharge operation, and a semiconductor memory device including the same.

One embodiment of the present disclosure provides a power on reset circuit including: a voltage dividing unit suitable for dividing an external power supply voltage according to a resistance ratio to output a divided voltage; a signal generating unit suitable for outputting a power on reset signal when the divided voltage has a set level or higher; and a resistance adjusting unit suitable for adjusting the resistance ratio of the voltage dividing unit in response to the power on reset signal.

Another embodiment of the present disclosure provides a semiconductor memory device including: a voltage supplying unit operable in response to a first enable signal, and suitable for applying an operation voltage to word lines connected to memory cells and discharging potential levels of the word lines in response to a voltage detecting signal; an external voltage detecting unit suitable for detecting that an external power supply voltage is decreased to a third set level or lower and outputting the voltage detection signal; a power on reset circuit suitable for detecting that the external power supply voltage is increased to a first set level or higher and outputting a power on reset signal, and detecting that the external power supply voltage is decreased to a second set level or lower and allowing a logic level of the power on reset signal to be transitioned; and a control logic generating the first enable signal in response to the power on reset signal.

Still another embodiment of the present disclosure provides a semiconductor memory device including: a power on reset circuit suitable for outputting a power on reset signal of a first logic level when an external power supply voltage is increased to a first set level or higher, and outputting the power on reset signal of a second logic level when the external power supply voltage is decreased to a second set level or lower; an external power detecting unit suitable for outputting a detection signal when the external power supply voltage is decreased to a third set level or lower; a control logic generating an enable signal in response to the power on reset signal; and a discharge unit connected to word lines of memory cells, and suitable for discharging potential levels of the word lines in response to the enable signal and detection signal. The second set level may be lower than the third set level.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Advantages and features of the present invention, and methods for achieving the same will be cleared with reference to exemplary embodiments described later in detail together with the accompanying drawings. Accordingly, the present invention is not limited to the following embodiments but embodied in other types. Rather, these embodiments are provided so that this disclosure will be thorough, and convey the technical idea of the present disclosure to those skilled in the art.

In addition, if certain parts are described as being connected to other parts, they are not only directly connected to the other parts, but also indirectly connected to the other parts with any other device intervened therebetween. In addition, when an element is referred to as "comprising" or "including" a component, it does not preclude another component but may further include the other component unless the context clearly indicates otherwise.

Figure 1:
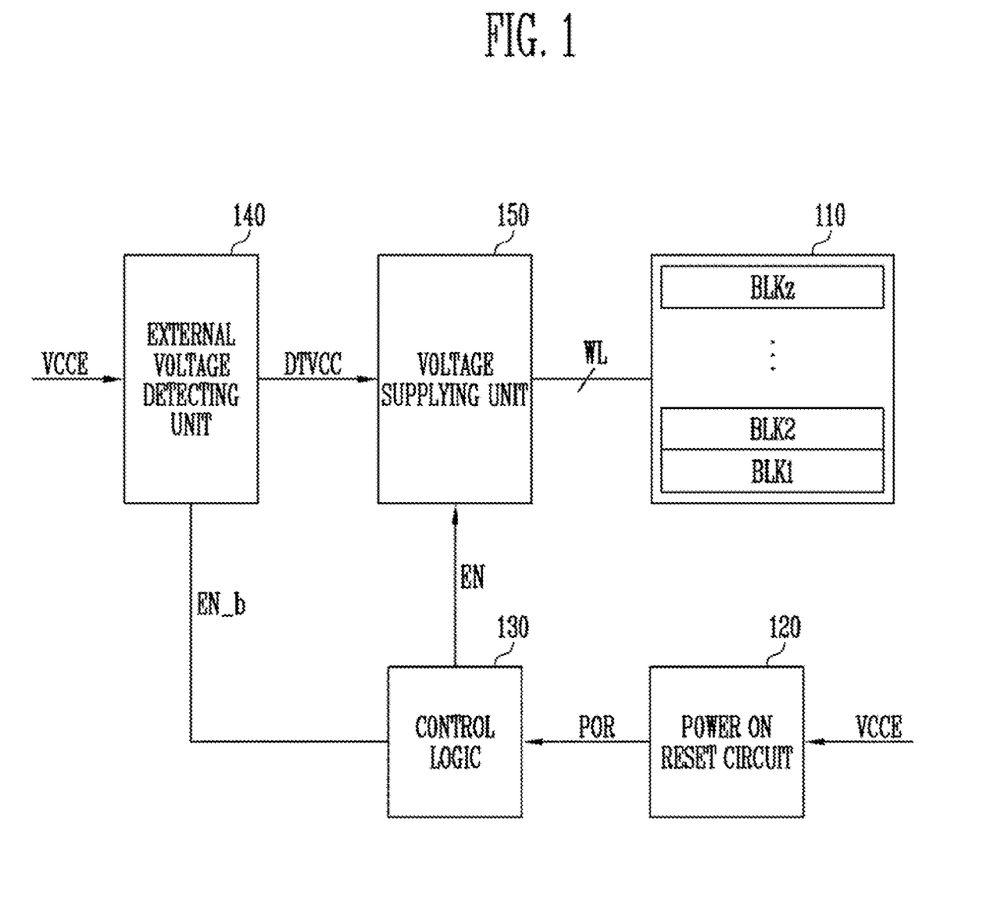
FIG. 1 is a block diagram illustrating a semiconductor memory device according to an embodiment of the present disclosure.

FIG. 1 is a block diagram illustrating a semiconductor memory device 100 according to an embodiment of the present disclosure.

Referring to FIG. 1, the semiconductor memory device 100 includes a memory cell array 110, a power on reset circuit 120, a control logic 130, an external voltage detecting unit 140, and a voltage supplying unit 150.

The memory cell array 110 includes a plurality of memory blocks BLK1 to BLKz. The plurality of memory blocks BLK1 to BLKz are connected to the voltage supplying unit 150 through word lines WL.

Each of the plurality of memory blocks BLK1 to BLKz includes a plurality of memory cells. As an example, the plurality of memory cells are nonvolatile memory cells, and in particular, the plurality of memory cells may be charge trap device-based nonvolatile memory cells.

Memory cells connected to a single word line among the plurality of memory cells are defined as a single page. In other words, the memory cell array 110 is formed of a plurality of pages. In addition, each of the plurality of memory blocks BLK1 to BLKz of the memory cell array 110 includes a plurality of memory strings. Each of the plurality of memory strings includes a drain selection transistor cell directly connected between a bit line and a source line, a plurality of memory cells, and a source selection transistor cell.

When an external power supply voltage VCCE supplied from the outside of a semiconductor memory device is increased to a first set level or higher during power up, the power on reset circuit 120 increases a power on reset signal POR to a first logic level. In addition, when the external power supply voltage VCCE is decreased to a second set level or lower during power down, the power on reset circuit 120 decreases a power on reset signal POR to a second logic level. Then, when the external power supply voltage VCCE is further decreased, the power on reset circuit 120 is disabled. In other words, the power on reset circuit 120 generates the power on reset signals POR of different logic level according to different detection reference levels or the first and second set levels during the power up and the power down. At this point, the second set level may be set to be lower than the first set level.

The control logic 130 outputs an enable signal EN-b for activating the external voltage detecting unit 140 and an enable signal EN for activating the voltage supplying unit 150. In addition, the control logic 130 is reset in response to a power on reset signal POR output from the power on reset circuit 120.

The external voltage detecting unit 140 is activated in response to the enable signal EN-b output from the control logic 130, and when the external power supply voltage VCCE is powered down and a potential level thereof is lowered to a third set level or lower, the external voltage detecting unit 140 detects the lowered potential level and outputs a detection signal DTVCC. At this point, the third set level may be set to be higher than the second set level.

The voltage supplying unit 150 generates operation voltages to be applied to word lines WL of the memory cell array 110 in response to the enable signal EN output from the control logic 130. In addition, when the external power supply voltage VCCE is powered down, the voltage supplying unit 150 discharges a potential level of the word line WL to a ground level in response to the detection signal DTVCC output from the external voltage detecting unit 140.

During the power down, the power on reset circuit 120 of the semiconductor memory device 100 according to an embodiment of the present disclosure outputs the power on reset signal POR according to the second set level as a detection reference level, which is lower than the third set level. Accordingly, when the external power supply voltage VCCE is lowered to the third set level but is higher than the second set level during the power down, the power on reset circuit 120 outputs the power on reset signal POR corresponding to a power on operation. Thus, the control logic 130 continuously outputs the enable signal EN for activating the voltage supplying unit 150, and the voltage supplying unit 150 maintains activated in response to the enable signal EN. At this point, the external voltage detecting unit 140 outputs the detection signal DTVCC, and the voltage supplying unit 150 performs an operation for discharging the word lines WL in response to the detection signal DTVCC.

Figure 2:
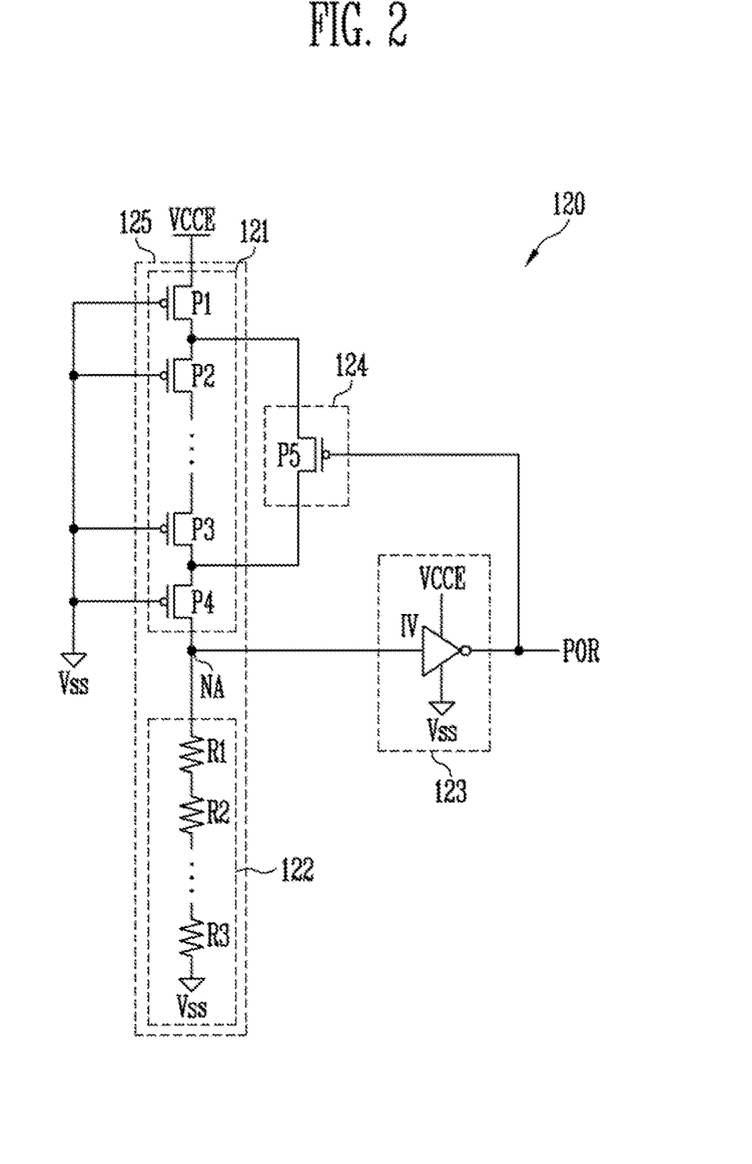
FIG. 2 is a circuit diagram illustrating a power on reset circuit.

FIG. 2 is a circuit diagram illustrating the power on reset circuit 120 described with reference to FIG. 1.

Referring to FIG. 2, the power on reset circuit 120 includes a voltage dividing unit 125, a signal generating unit 123, and a resistance adjusting unit 124.

The voltage dividing unit 125 includes first and second resistor units 121 and 122.

The first resistor unit 121 includes a plurality of transistors P1 to P4. The plurality of transistors P1 to P4 are serially connected between a node of the external power supply voltage VCCE and an internal node NA, and gates of the plurality of transistors P1 to P4 are connected to a ground voltage Vss. The plurality of transistors P1 to P4 may be formed of PMOS transistors.

The second resistor unit 122 includes a plurality of resistors R1 to R3 serially connected between the internal node NA and the ground voltage Vss.

The first and second resistor units 121 and 122 divide the external power supply voltage VCCE according to a resistance value ratio, and apply the divided voltage to the internal node NA.

The signal generating unit 123 is configured with an inverter IV. When the potential level at the internal node NA is increased higher than a threshold value of a PMOS transistor of the inverter IV, the signal generating unit 123 outputs the power on reset signal POR of a logic low level. When the potential level at the internal node NA is decreased lower than the threshold voltage of the PMOS transistor of the inverter IV, the signal generating unit 123 outputs the power on reset signal POR of a logic high level. When the external power supply voltage VCCE is further decreased, the power on rest signal POR is output at a potential level identical to the external power supply voltage VCCE.

The resistance adjusting unit 124 includes a transistor P5 connected to a node between transistors P1 and P2 and a node between transistors P3 and P4 of the first resistor unit 121. A connection structure of the transistor P5 may be changed according to a variable resistance value of the first resistor unit 121. The power on reset signal POR is applied to a gate of the transistor P5.

Figure 3:
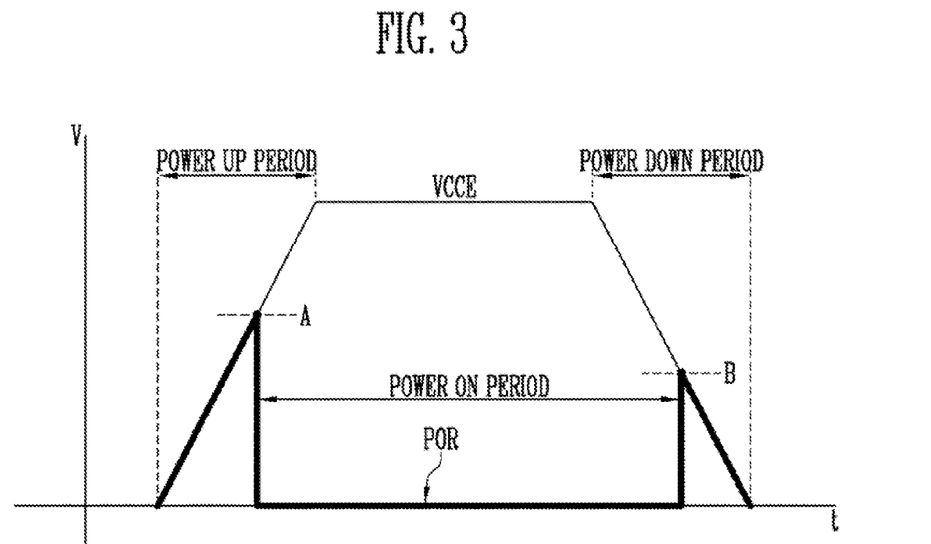
FIG. 3 is a signal waveform diagram illustrating an operation of the power on reset circuit according to the present disclosure.

FIG. 3 is a signal waveform diagram illustrating an operation of the power on reset circuit 120 according to the present disclosure.

An operation of the power on reset circuit will be described with reference to FIGS. 2 and 3.

When the external power supply voltage VCCE is increased during the power up, the first and second resistor units 121 and 122 divide the external power supply voltage VCCE according to a resistance ratio, and apply the divided voltage to the internal node NA. When the potential level at the internal node NA is increased higher than a threshold value of the PMOS transistor of the inverter IV, the signal generating unit 123 outputs the power on reset signal POR of a logic low level. The potential level of the external power supply voltage VCCE at the time when the power on reset signal POR of the logic low level is output may be defined as the first set level A.

The resistance adjusting unit 124 decreases the resistance value of the first resistor unit 121 by a set value in response to the power on reset signal POR of the logic low level. Accordingly, the potential level at the internal node NA is further increased.

The external power supply voltage VCCE maintains a certain level and then the potential level thereof is lowered during the power down. Accordingly, when the potential level at the internal node NA is lowered below the threshold voltage of the PMOS transistor of the inverter IV, the signal generating unit 123 outputs the power on reset signal POR of a logic high level. The potential level of the external power supply voltage VCCE at the time when the power on reset signal POR is transitioned from the logic low level to the logic high level may be defined as the second set level B.

The resistance adjusting unit 124 adjusts the resistance value of the first resistor unit 121 to be lowered by the power on reset signal POR of the logic low level during a power on, and allows the second set level B to be lower than the first set level A during the power down.

During the power on, the power on reset signal POR is output at a logic low level.

Figure 4:
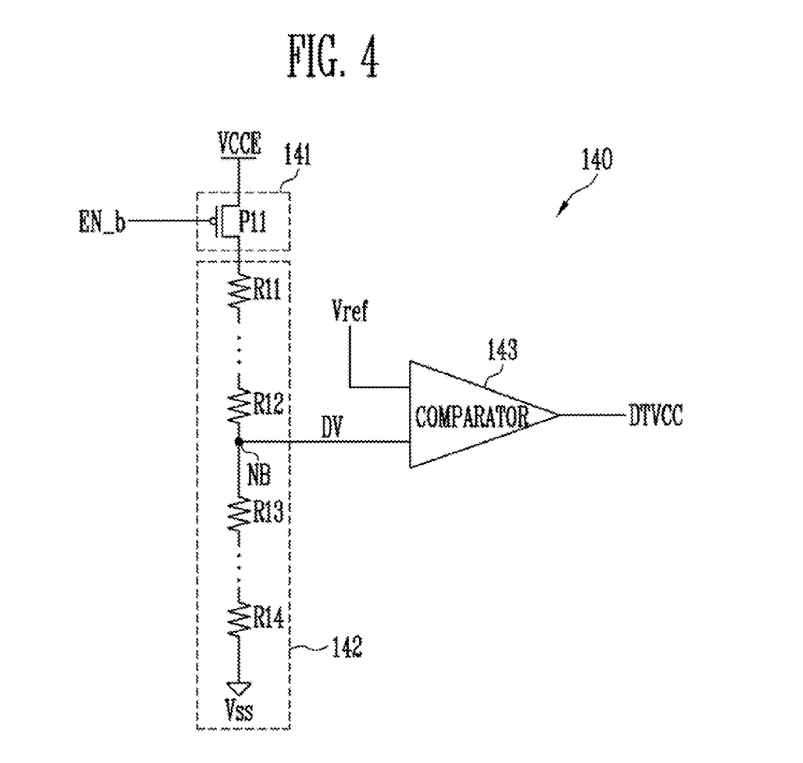
FIG. 4 is a circuit diagram illustrating an external power supply voltage detecting unit.

FIG. 4 is a circuit diagram illustrating the external power supply voltage detecting unit 140 described with reference to FIG. 1.

Referring to FIG. 4, the external power supply voltage detecting unit 140 includes an activating unit 141, a voltage dividing unit 142, and a signal generating unit 143.

The activating unit 141 includes a transistor P11 and supplies the external power supply voltage VCCE to the voltage dividing unit 142 in response to the enable signal EN_b.

The voltage dividing unit 142 includes a plurality of serially connected resistors R1 to R14, and divides the external power supply voltage VCCE supplied through the activating unit 141 according to a resistance ratio to output the divided voltage DV through an Internal node NB.

The signal generating unit 143 may be formed of a comparator. The signal generating unit 143 compares the divided voltage DV with a reference voltage Vref to output the detection signal DTVCC. For example, when the divided voltage DV is smaller than the reference voltage Vref, the detection signal DTVCC of a high level is output.

Figure 5:
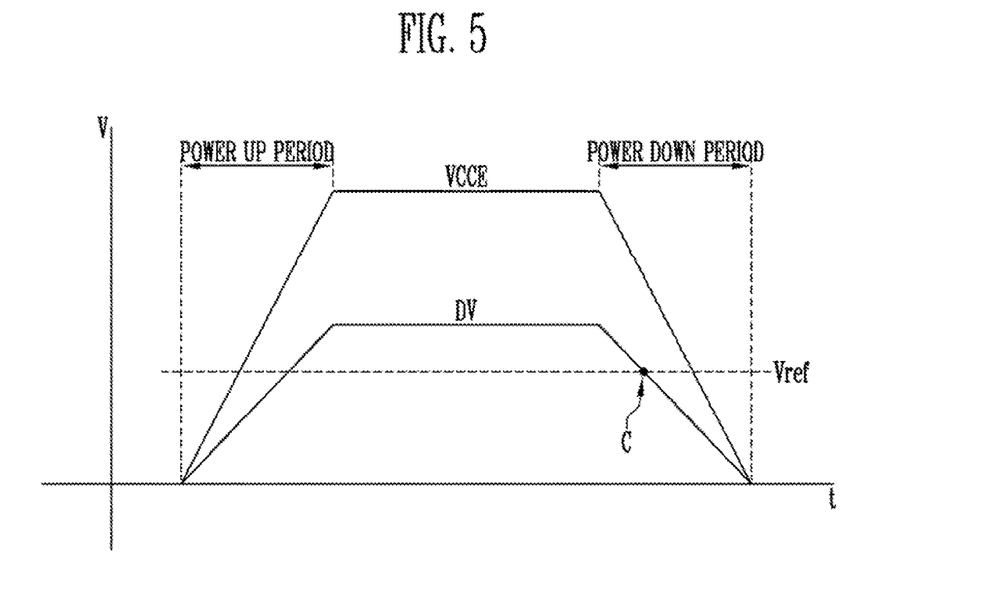
FIG. 5 is a signal waveform diagram illustrating an operation of the external power supply voltage detecting unit according to an embodiment of the present disclosure.

FIG. 5 is a signal waveform diagram illustrating an operation of the external power supply voltage detecting unit 140 according to an embodiment of the present disclosure.

An operation of the external power supply voltage detecting unit 140 according to an embodiment of the present disclosure will be described with reference to FIGS. 4 and 5.

The activating unit 141 applies the external power supply voltage VCCE to the voltage dividing unit 142 in response to the enable signal EN_b that is activated at a low level after the power on.

The voltage dividing unit 142 divides the external power supply voltage VCCE according to the resistance ratio to output the divided voltage DV through the internal node NB. The resistance ratio of the voltage dividing unit 142 is adjusted so that the divided voltage DV is higher than the reference voltage Vref while the external power supply voltage VCCE stays at a certain level.

Thereafter, when the external power supply voltage VCCE is powered down, the potential level of the divided voltage DV is decreased, and when the divided voltage DV is lower than the reference voltage Vref, the detection signal DTVCC of a high level is output. The potential level of the external power supply voltage VCCE at the time when the detection signal DTVCC of a high level is output may be defined as the third set voltage C, which is higher than the second set voltage B described with reference to FIGS. 1 and 3.

Figure 6:
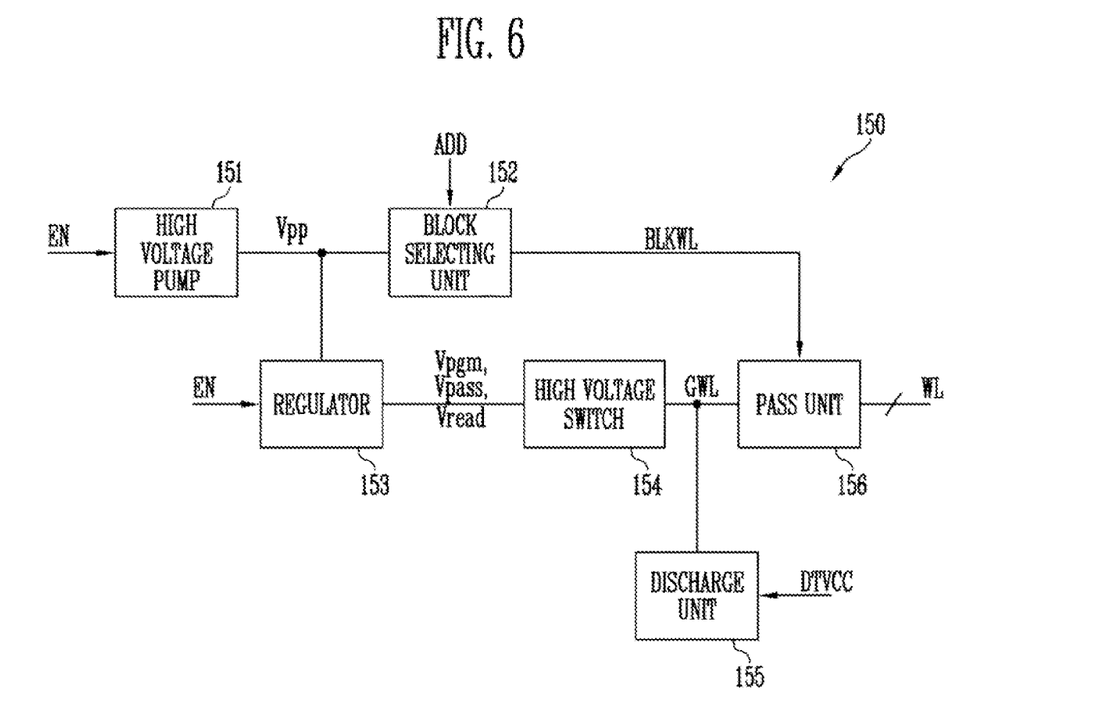
FIG. 6 is a block diagram illustrating a voltage supplying unit.

FIG. 6 is a block diagram illustrating the voltage supplying unit 150 described with reference to FIG. 1.

Referring to FIG. 6, the voltage supplying unit 150 includes a high voltage pump 151, a block selecting unit 152, a regulator 153, a high voltage switch 154, a discharge unit 155, and a pass unit 156.

The high voltage pump 151 is activated in response to the enable signal EN output from the control logic 130, performs a pumping operation to generate a high voltage Vpp, and outputs the high voltage Vpp.

The block selecting unit 152 receives the high voltage Vpp output from the high voltage pump 151 to output a block selection signal BLKWL corresponding to at least one of the plurality of memory blocks BLK1 to BLKz included in the memory cell array 110 in response to an address signal ADD. The block selection signal BLKWL may have a potential level of the high voltage Vpp.

The regulator 153 receives the high voltage Vpp output from the high voltage pump 151 to generate a plurality of operation voltages (e.g., a program voltage Vpgm, pass voltage Vpass, read voltage Vread, etc.) by using the high voltage Vpp.

The high voltage switch 154 transmits the plurality of operation voltages Vpgm, Vpass, and Vread, which are generated from the regulator 153, to global word lines GWL connected to the pass unit 156.

The discharge unit 155 is connected to the global word lines GWL and discharges the potential level of the word lines WL connected through the pass unit 156 in response to the detection signal DTVCC during the power down.

The pass unit 156 connects the global word lines GWL and the word lines WL in response to the block selection signal BLKWL output from the block selecting unit 152.

An operation of a semiconductor memory device according to an embodiment of the present disclosure will be described with reference to FIGS. 1 to 6.

When the external power supply voltage VCCE is increased to the first set level A or higher during the power up, the power on reset circuit 120 detects this to output the power on reset signal POR of a logic low level.

The control logic 130 outputs the enable signal EN-b for activating the external voltage detecting unit 140 and the enable signal EN for activating the voltage supplying unit 150 in response to the power on reset signal POR of the logic low level.

The high voltage pump 151 of the voltage supplying unit 150 activates in response to the enable signal EN output from the control logic 130, performs the pumping operation to generate the high voltage Vpp, and outputs the high voltage Vpp.

The block selecting unit 152 receives the high voltage Vpp output from the high voltage pump 151 to output the block selection signal BLKWL corresponding to at least one of the plurality of memory blocks BLK1 to BLKz included in the memory cell array 110 in response to the address signal ADD.

The regulator 153 receives the high voltage Vpp output from the high voltage pump 151 to generate the plurality of operation voltages (e.g., the program voltage Vpgm, pass voltage Vpass, read voltage Vread, etc.) by using the high voltage Vpp.

The high voltage switch 154 transmits the plurality of operation voltages Vpgm, Vpass, and Vread, which are generated from the regulator 153, to the global word lines GWL connected to the pass unit 156.

The pass unit 156 connects the global word lines GWL and the word lines WL to apply the plurality of operation voltages Vpgm, Vpass, and Vread to the word lines WL in response to the block selection signal BLKWL output from the block selecting unit 152.

Thereafter, when the external power supply voltage VCCE maintained at a certain level starts to be gradually decreased, the external voltage detecting unit 140 detects that the external power supply voltage VCCE is decreased to the third set level C or lower, and outputs the detection signal DTVCC. At this point, the third set level is higher than the second set level.

The discharge unit 155 of the voltage supplying unit 150 discharges the potential levels of the word lines WL connected through the pass unit 156 in response to the detection signal DTVCC.

Thereafter, when the external power supplying voltage VCCE is further decreased to the second set level B or lower, the power on reset circuit 120 allows the power on reset signal POR to be transitioned from the logic low level to the logic high level and outputs the power on reset signal POR.

The control logic 130 deactivates the enable signal EN_b and the enable signal EN in response to the power on reset signal POR of the logic high level and operations of the external voltage detecting unit 140 and voltage supplying unit 150 are disabled.

According to the above-described technique, the word line discharge operation may be stably performed during the power down by setting a detection reference level of the external power supplying voltage VCCE, which is detected by the external voltage detecting unit 140 during the power down, to be higher than a detection reference level for detecting the power down in the power on reset circuit 120.

Figure 7:
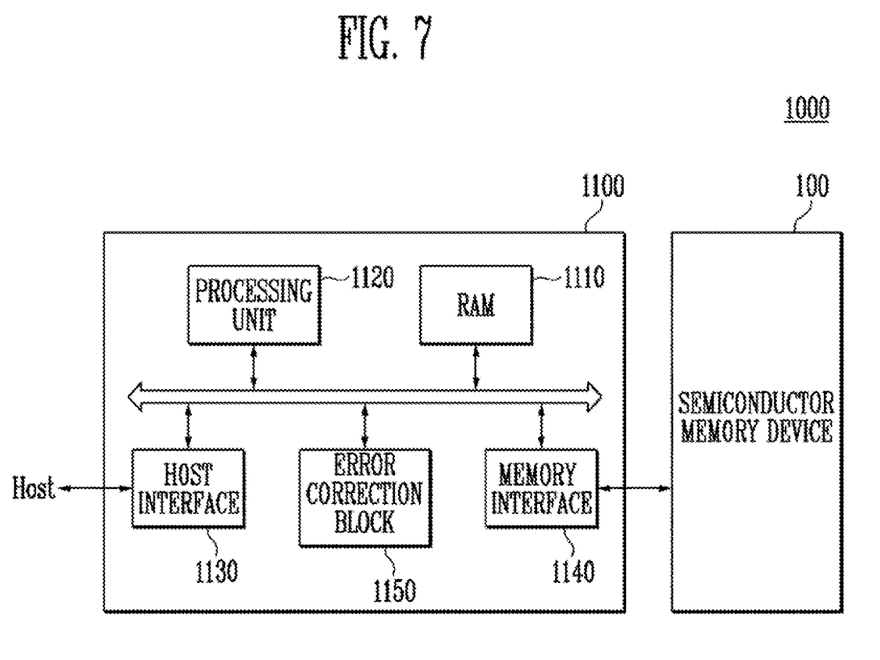
FIG. 7 is a block diagram illustrating a memory system.

FIG. 7 is a block diagram illustrating a memory system including the semiconductor memory device described with reference to FIG. 1.

Referring FIG. 7, the memory system 1000 includes the semiconductor memory device 100 and a controller 1100.

The semiconductor memory device 100 may include the semiconductor device described in relation to FIG. 1.

The controller 1100 is connected to a Host and the semiconductor memory device 100. In response to a request from the Host, the controller 1100 accesses the semiconductor memory device 100. For example, the controller 1100 controls a read, write, remove, and background operation of the semiconductor memory device 100. The controller 1100 provides an interface between the Host and the semiconductor memory device 100. The controller 1100 drives firmware for controlling the semiconductor memory device 100.

The controller 1100 includes a RAM 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the Host, and a buffer memory between the semiconductor memory device 100 and the Host. The processing unit 1120 controls an entire operation of the controller 1100. In addition, the controller 1100 may temporarily store program data provided from the host at the write operation.

The host interface 1130 includes a protocol for performing data exchange between the host and controller 1100. In an embodiment, the controller 1200 communicates with the Host through at least one of various interface protocols including a Universal Serial Bus (USB) protocol, a multimedia card (MMC) protocol, peripheral component interconnection (PCI) protocol, PCI-express (PCI-E) protocol, Advanced Technology Attachment (ATA) protocol, Serial-ATA protocol, Parallel-ATA protocol, small computer small interface (SCSI) protocol, enhanced small disk interface (ESDI) protocol, and Integrated Drive Electronics (IDE) protocol, private protocol, and the like.

The memory interface 1140 performs interfacing with the semiconductor memory device 100. For example, the memory interface includes a NAND interface or NOR interface.

The error correction block 1150 detects to correct an error in data received from the semiconductor memory device 100 by using the error correction code. The processing unit 1120 may adjust the read voltage according to an error detection result from the error correction block 1150, and control the semiconductor memory device 100 to perform re-reading. As an embodiment, the error correction block may be provided as an element of the controller 1100.

The controller 1100 and the semiconductor memory device 10 may be integrated to one semiconductor device. As an embodiment, the controller 1100 and the semiconductor memory device 10 may be integrated to one semiconductor device and form a memory card. For example, the controller 1100 and the semiconductor memory device 100 may be integrated to one semiconductor device and form a memory card including a personal computer memory card international association (PCMCIA), compact flash card (CF), smart media card (SMC), memory stick multimedia card (MMC, RS-MMC, or MMCmicro), SD card (SD, miniSD, microSD, or SDHC), universal flash storage (UFS) or the like.

The controller 1100 and the semiconductor memory device 100 may be integrated to one semiconductor device and form a solid state drive. The SSD includes a storage device formed to store data in a semiconductor memory. When the memory system 1000 is used as the SSD, an operation speed of the Host connected to the memory system 2000 may be phenomenally improved.

As another example, the memory system 1000 may be provided as one of various elements of an electronic device including a computer, Ultra Mobile PC (UMPC), workstation, net-book, Personal Digital Assistants (PDA), portable computer, web tablet, wireless phone, mobile phone, smart phone, e-book, portable multimedia player (PMP), game console, navigation device, black box, digital camera, 3-dimensional television, digital audio recorder, digital audio player, digital picture recorder, digital picture player, digital video recorder, digital video player, a device capable of transmitting/receiving information in an wireless environment, one of various devices for forming a home network, one of various electronic devices for forming a computer network, one various electronic devices for forming a telematics network, RFID device, one of various elements for forming a computing system, or the like.

As an embodiment, the semiconductor memory device 100 or the memory system 1000 may be embedded in various types of packages. For example, the semiconductor memory device 100 or the memory system 1000 may be packaged to be embedded in a type including Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 8:
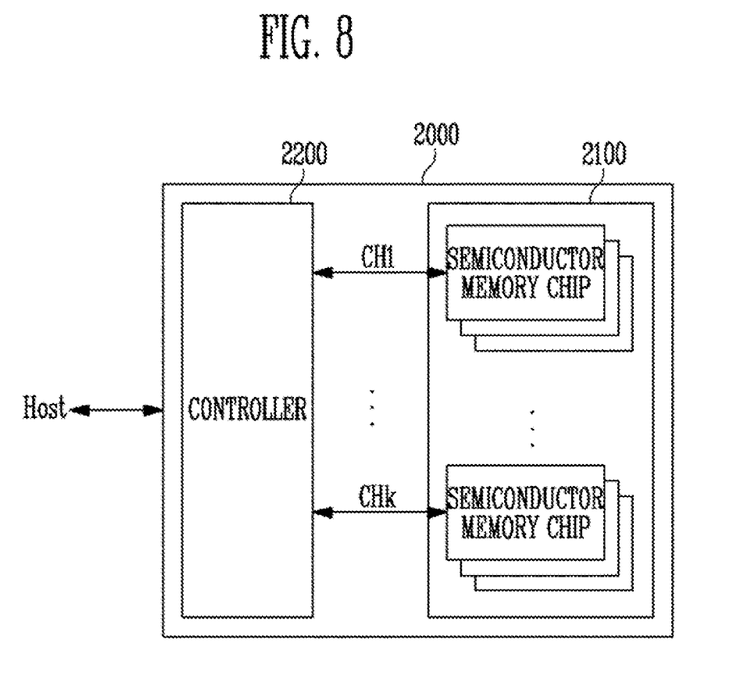
FIG. 8 is a block diagram illustrating an application example of the memory system.

FIG. 8 is a block diagram illustrating an application of the memory system described with reference to FIG. 7.

Referring FIG. 8, the memory system 2000 includes the semiconductor memory device 2100 and a controller 2200. The semiconductor memory device 2100 includes a plurality of memory chips. The plurality of semiconductor memory chips are divided into a plurality of groups.

In FIG. 8, it is shown that each of the plurality of groups communicates with the controller 2200 through first to k-th channels CH1 to CHk. Each semiconductor memory chip is configured to identically operate to one of the semiconductor memory device 100 described in relation to FIG. 1.

Each group communicates with the controller 2200 through one common channel. The controller 2200 is configured identically to the controller 1100 described in relation to FIG. 7 and is configured to control a plurality of memory chips of the semiconductor memory device 2100 through the plurality of channels CH1 to CHk.

Figure 9:
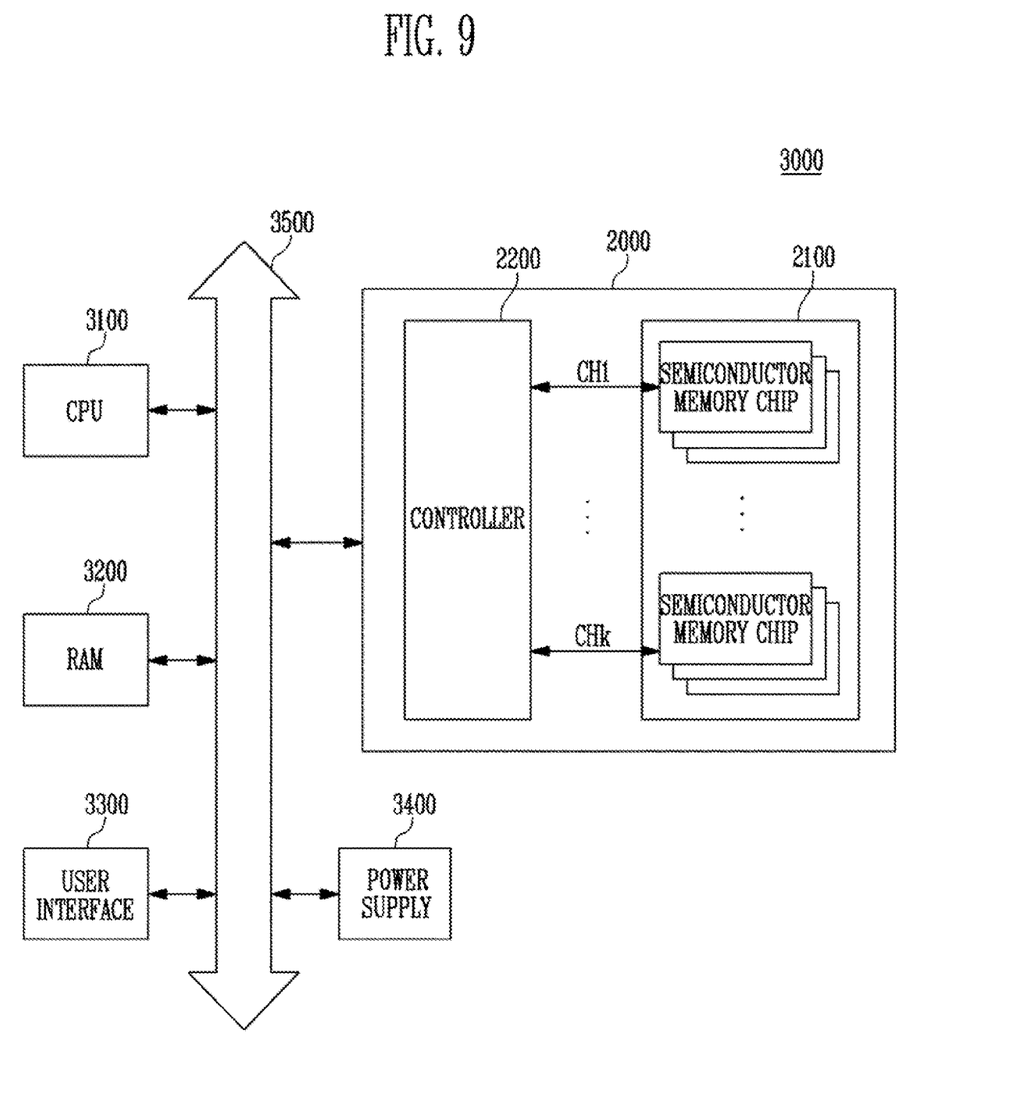
FIG. 9 is a block diagram illustrating a computing system including the memory system.

FIG. 9 is a block diagram illustrating a computing system including the memory system described with reference to FIG. 8.

Referring to FIG. 9, the computing system 3000 includes a central processing unit 3100, a RAM 3200, a user interface 3300, a power supply 3400, a system bus 3500, and a memory system 2000.

The memory system 2000 is electrically connected to the CPU 3100, Ram 3200, user interface 3300, and power supply 3400 through the system bus 3500. Data provided through the user interface 3300 or processed by the CPU 3100 is stored in the memory system 2000.

In FIG. 9, the semiconductor memory device 2100 is shown to be connected to the system bus 3500 through the controller 2200. However, the semiconductor memory device 2100 may be directly connected to the system bus 3500. At this point, a function of the controller 2200 may be performed by the CPU 3100 and RAM 3200.

In FIG. 9, the memory system 200 described in relation to FIG. 8 is illustrated. However, the memory system 2000 may be replaced with the memory system 1000 described in relation to FIG. 7. As an embodiment, the computing system 3000 may include all the memory systems 1000 and 2000 described in relation to FIGS. 8 and 7.

According to embodiments of the present disclosure, during power down of an external power supply voltage, a stable word line discharge operation may be performed to reduce an error of a semiconductor memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A power on reset circuit comprising:
a voltage dividing unit configured to divide an external power supply voltage according to a resistance ratio to output a divided voltage;
a signal generating unit configured to output a power on reset signal when the divided voltage has a set level or higher; and
a resistance adjusting unit configured to adjust the resistance ratio of the voltage dividing unit in response to the power on reset signal,
wherein the voltage dividing unit comprises first resistor units and second resistor units,
wherein the first resistor units comprises transistors serially connected between the external power supply voltage and an internal node, and
wherein the resistance adjusting unit decreases a resistance value of the first resistor units in response to the power on reset signal.

2. The power on reset circuit according to claim 1, wherein the second resistor unit comprises a plurality of resistors serially connected between the internal node and a ground voltage.

3. The power on reset circuit according to claim 1,
wherein when the external power supply voltage is higher than a first set level during a power up period, the power on reset circuit outputs the power on reset signal of a first logic level, and
wherein when the external power supply voltage is lower than a second set level during a power down period, the power on reset circuit outputs the power on reset signal of a second logic level.

4. The power on reset circuit according to claim 3, wherein the first set level is higher than the second set level.

5. A semiconductor memory device comprising:
a voltage supplying unit operable in response to a first enable signal, and suitable for applying an operation voltage to word lines connected to memory cells and discharging potential levels of the word lines in response to a voltage detecting signal;
an external voltage detecting unit suitable for detecting that an external power supply voltage is decreased to a third set level or lower and outputting the voltage detection signal;
a power on reset circuit suitable for detecting that the external power supply voltage is increased to a first set level or higher and outputting a power on reset signal, and detecting that the external power supply voltage is decreased to a second set level or lower and allowing a logic level of the power on reset signal to be transitioned; and a control logic generating the first enable signal in response to the power on reset signal.

6. The semiconductor memory device according to claim 5, wherein the third set level is higher than the second set level.

7. The semiconductor memory device according to claim 5, wherein the voltage supplying unit comprises:

a pump unit suitable for generating a high voltage in response to the first enable signal;

a regulator suitable for regulating the high voltage in response to the enable signal to generate a plurality of operation voltages, and applying the plurality of operation voltages to a global word line;

a block selecting unit suitable for generating a block selection signal in response to an address signal;

a pass unit suitable for connecting the global word line and the word lines in response to the block selection signal; and a discharge unit connected to the global word line, and suitable for discharging potential levels of the word lines electrically connected through the pass unit in response to the detection signal.

8. The semiconductor memory device according to claim 5, wherein the voltage detecting unit comprises:

an activating unit suitable for receiving the external power supply voltage in response to a second enable signal output from the control logic;

a voltage dividing unit suitable for dividing an external power supply voltage, which is provided through the activating unit, according to a resistance ratio to output the divided voltage; and a signal generating unit suitable for comparing the divided voltage with a reference voltage to output the detection signal.

9. The semiconductor memory device according to claim 5, wherein the power on reset circuit comprises:

a voltage dividing unit suitable for dividing the external power supply voltage according to a resistance ratio to output a divided voltage;

a signal generating unit suitable for outputting a power on reset signal when the divided voltage has a set level or higher; and a resistance adjusting unit suitable for adjusting the resistance ratio of the voltage dividing unit in response to the power on reset signal.

10. The semiconductor memory device according to claim 9, wherein the voltage dividing unit comprises first and second resistor units.

11. The semiconductor memory device according to claim 10, wherein the first resistor unit comprises transistors serially connected between the external power supply voltage and an internal node.

12. The semiconductor memory device according to claim 11, wherein the second resistor unit comprises a plurality of resistors serially connected between the internal node and a ground voltage.

13. The semiconductor memory device according to claim 9, wherein the resistance adjusting unit decreases a resistance value of the first resistor unit in response to the power on reset signal.

14. The semiconductor memory device according to claim 5, wherein when the external power supply voltage is higher than a first set level during a power up period, the power on reset circuit outputs the power on reset signal of a first logic level, and wherein when the external power supply voltage is lower than a second set level during a power down period, the power on reset circuit outputs the power on reset signal of a second logic level.

15. The semiconductor memory device according to claim 5, wherein the second set level is higher than the third set level.

16. A semiconductor memory device comprising:

a power on reset circuit suitable for outputting a power on reset signal of a first logic level when an external power supply voltage is increased to a first set level or higher, and outputting the power on reset signal of a second logic level when the external power supply voltage is decreased to a second set level or lower;

an external power detecting unit suitable for outputting a detection signal when the external power supply voltage is decreased to a third set level or lower;

a control logic generating an enable signal in response to the power on reset signal; and a discharge unit connected to word lines of memory cells, and suitable for discharging potential levels of the word lines in response to the enable signal and detection signal, wherein the second set level is lower than the third set level.

17. The semiconductor memory device according to claim 16, wherein after the power on reset signal of the first logic level is output, a detection reference level for detecting the external power supply voltage is changed from the first set level to the second set level in response to the power on reset signal of the first logic level.

\* \* \* \* \*